US007019876B2

United States Patent
Yang (10) Patent No.: US 7,019,876 B2
(45) Date of Patent: Mar. 28, 2006

(54) MICRO-MIRROR WITH ROTOR STRUCTURE

(75) Inventor: Xiaofeng Yang, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 438 days.

(21) Appl. No.: 10/208,590

(22) Filed: Jul. 29, 2002

(65) Prior Publication Data

US 2004/0017599 A1 Jan. 29, 2004

(51) Int. Cl.
G02B 26/08 (2006.01)
(52) U.S. Cl. .................. 359/198; 359/201; 359/224; 359/226; 345/32
(58) Field of Classification Search .............. None
See application file for complete search history.

(56) References Cited

U.S. PATENT DOCUMENTS 5,235,454 A * 8/1993 Iwasaki .................... 359/198

| 5,640,214 A | 6/1997 | Florence |
| 5,748,172 A | 5/1998 | Song et al. |
| 5,986,381 A | 11/1999 | Hoen et al. |
| 6,201,629 B1 | 3/2001 | McClelland et al. |
| 6,259,548 B1 | 7/2001 | Tsugai et al. |
| 6,353,492 B1 | 3/2002 | McClelland et al. |
| 6,359,718 B1 | 3/2002 | Lin et al. |

FOREIGN PATENT DOCUMENTS

JP 401107666 A * 4/1989

OTHER PUBLICATIONS

P.M. Hagelin, U. Krishnamoorthy, R. Conant, R.S. Muller, K.Y. Lau, O. Solgaard, "Integrated Micromachined Scanning Display Systems," Technical Digest of the 18th Congress of the Int'l Commission for Optics (ICO XVIII), San Francisco, Calif., Aug. 1999, pp. 472-473.

* cited by examiner

Primary Examiner—James Phan (57) ABSTRACT

A micro-mirror device includes a stator structure having a set of radial stator electrodes, a rotor structure having a set of radial rotor electrodes, a mirror mounted on the rotor structure, and a flexure structure suspending the rotor structure relative to the stator structure.

40 Claims, 10 Drawing Sheets

MICRO-MIRROR WITH ROTOR STRUCTURE

BACKGROUND OF THE DISCLOSURE

Micro-actuators have been formed on insulators or other substrates using micro-electronic techniques such as photolithography, vapor deposition and etching. Such micro-actuators are often referred to as micro-electromechanical system (MEMS) devices.

Optical switching technologies are being developed for optical communication and display systems. Known MEMS (microelectromechanical switch) approaches include electrostatic, magnetic, piezoelectric and thermal mechanical MEMS devices, which employ thin mirrors to reflect a light beam. These known approaches can involve complex position control systems, and utilize fragile structures which can provide low yield and reliability. High voltages of 200V or more to generate enough force to rotate the mirror can lead to integration difficulties and reliability problems. High quality mirror surfaces can be difficult to achieve due to thinness of the mirror plate and stresses applied during the fabrication processes. Another known MEMS approach employs inkjet fabrication technology, using high power for static holding power, and N×N mirrors to achieve N×N cross connects in an optical switching system due to its one dimensional approach. The inkjet approach is relatively slow due to its thermal actuation, and requires relatively large amounts of die space to achieve N×N cross connects.

It would be useful to provide an optical switch device which is reliable, relatively low cost, highly integrated, low power, and high speed.

DETAILED DESCRIPTION OF THE DISCLOSURE

A micro mover generates rotary step motion with a limited rotation angle (10 to 15 degrees in one exemplary embodiment). A bulk silicon micromachined mirror is built on top of the motor, in one exemplary embodiment using wet etch techniques, although other techniques can also be employed. This device can be used for deflecting the light to different location. The micro mover can be used for scanning mirror and display applications.

An embodiment of a micro mover structure is described which includes radial, electrostatically actuated stator and rotor electrodes to generate electrostatic rotary force and stepping motion on the rotor. In one exemplary embodiment, the step motion of the rotor can be actuated by changing the voltage on one of the sets of electrodes from high to low, or low to high, i.e. a digital control scheme. The micro mover structure includes suspended flexures on the rotor. A silicon micromachined mirror is fabricated on the rotor. The electrodes generate rotary step motion, deflecting the mirror through a limited rotation angle (10 to 15 degrees in one exemplary embodiment). This exemplary device can be used for deflecting a beam of light to different locations, which is useful, for example, as an all-optical switch for fiber optic communication, in display and spatial light modulator applications, and other applications.

Figure 1:
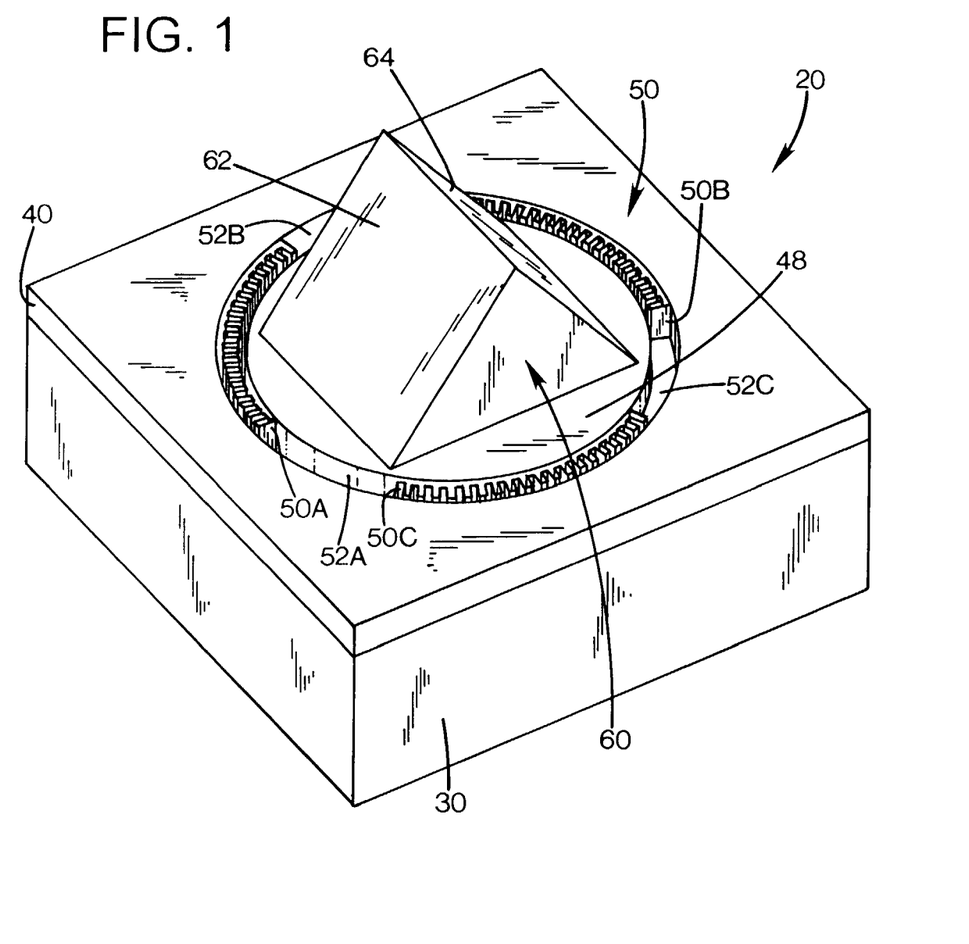
FIG. 1 is an isometric view of an exemplary embodiment of a micro mover in accordance with the invention.

FIG. 1 is an isometric view of an exemplary embodiment of a micro mover structure 20 in accordance with the invention. The structure includes a stator substrate 30 and a rotor substrate 40. In an exemplary embodiment, the substrates are fabricated from silicon, with processes similar to those used for integrated circuit fabrication employed to create electrodes and other features.

Figure 2:
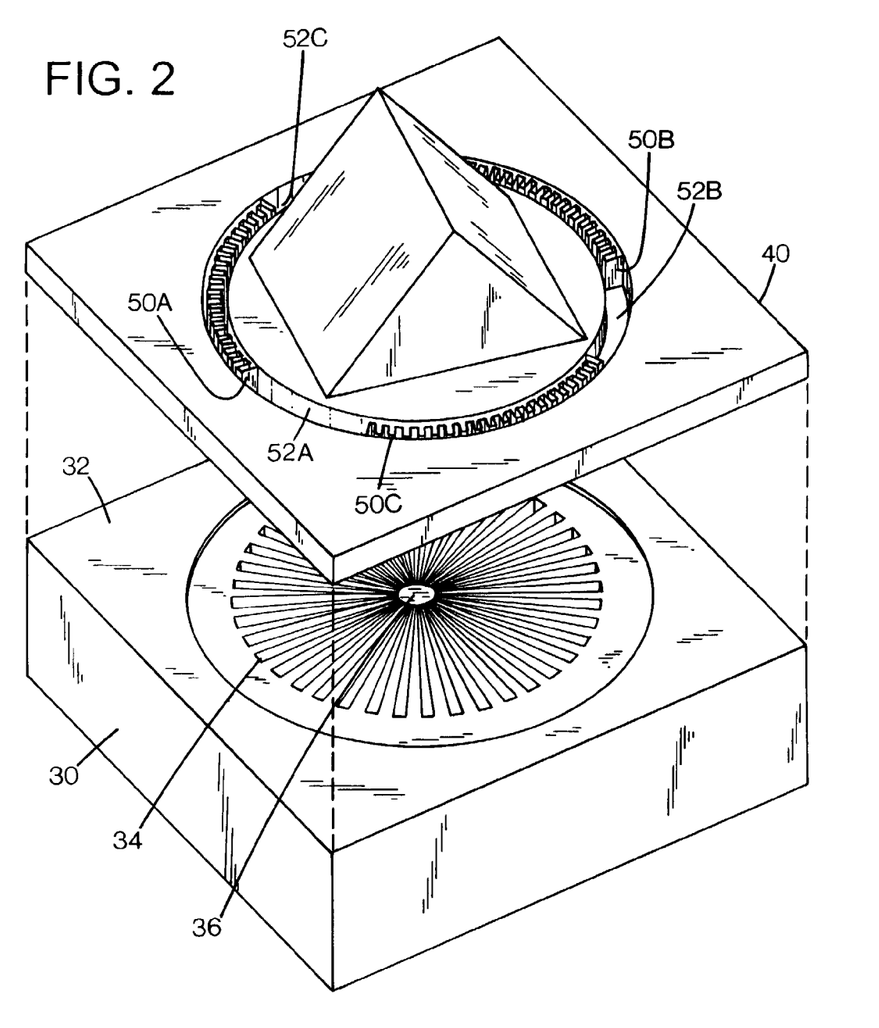
FIG. 2 shows a separated isometric top view of the stator and rotor comprising the micro mover structure of FIG. 1.
Figure 3:
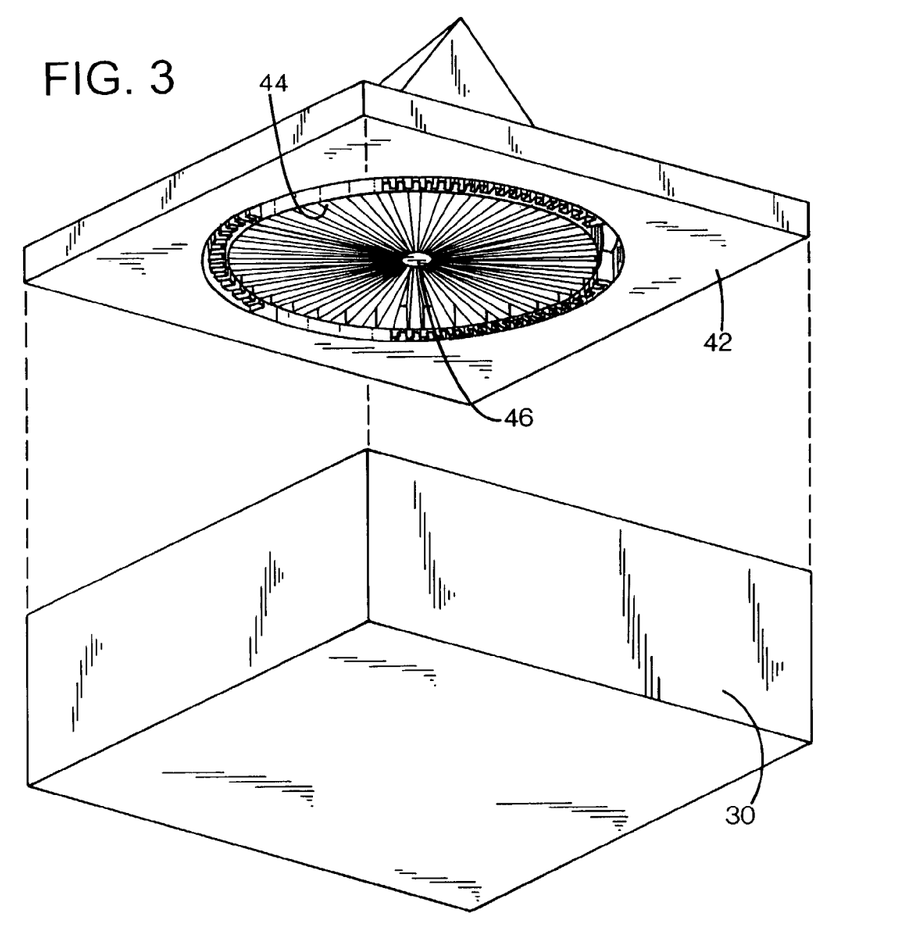
FIG. 3 shows a separated isometric bottom view of the stator and rotor comprising the micro mover of FIG. 1.

FIG. 2 shows a separated isometric top view of the stator substrate 30 and rotor substrate 40 comprising the micro mover structure 20. FIG. 3 shows a separated isometric bottom view of the stator substrate and rotor substrate comprising the micro mover. The stator substrate 30 has formed on its upper surface 32 a set of radial stator electrodes 34, which extend radially away from a stator center 36. In a similar fashion, the rotor substrate structure 40 has formed on its lower surface 42 a set of radial rotor electrodes 44. The electrodes are formed by conductive metal traces defined on the respective substrates, and the widths of the electrodes is tapered from a smaller dimension adjacent the rotor center to a larger dimension adjacent the periphery of the rotor portion.

When the stator structure 30 and the rotor structure 40 are assembled together as shown in FIG. 1, the stator center 36 and the rotor center 46 are vertically aligned, in that the stator center 36 (FIG. 2) is coaxial with the rotor center 46 (FIG. 3).

The rotor substrate structure 40 further includes a rotor portion 48 and a serpentine flexure 50 connecting the rotor portion to the substrate. The flexure allows the rotor portion 48 to rotate through a limited angular range with respect to the substrate 40.

A mirror structure 60 is formed on the top surface of the rotor portion 48, and is carried by the rotor portion through its angular range of movement. The mirror structure 60 defines two mirror surfaces 62, 64. In an exemplary embodiment, the mirror surfaces are defined by a bulk silicon micromachining (wet etch) process on crystal planes. Many applications will use only one mirror surface; two surfaces are naturally formed in this embodiment by a wet etch process.

Figure 4:
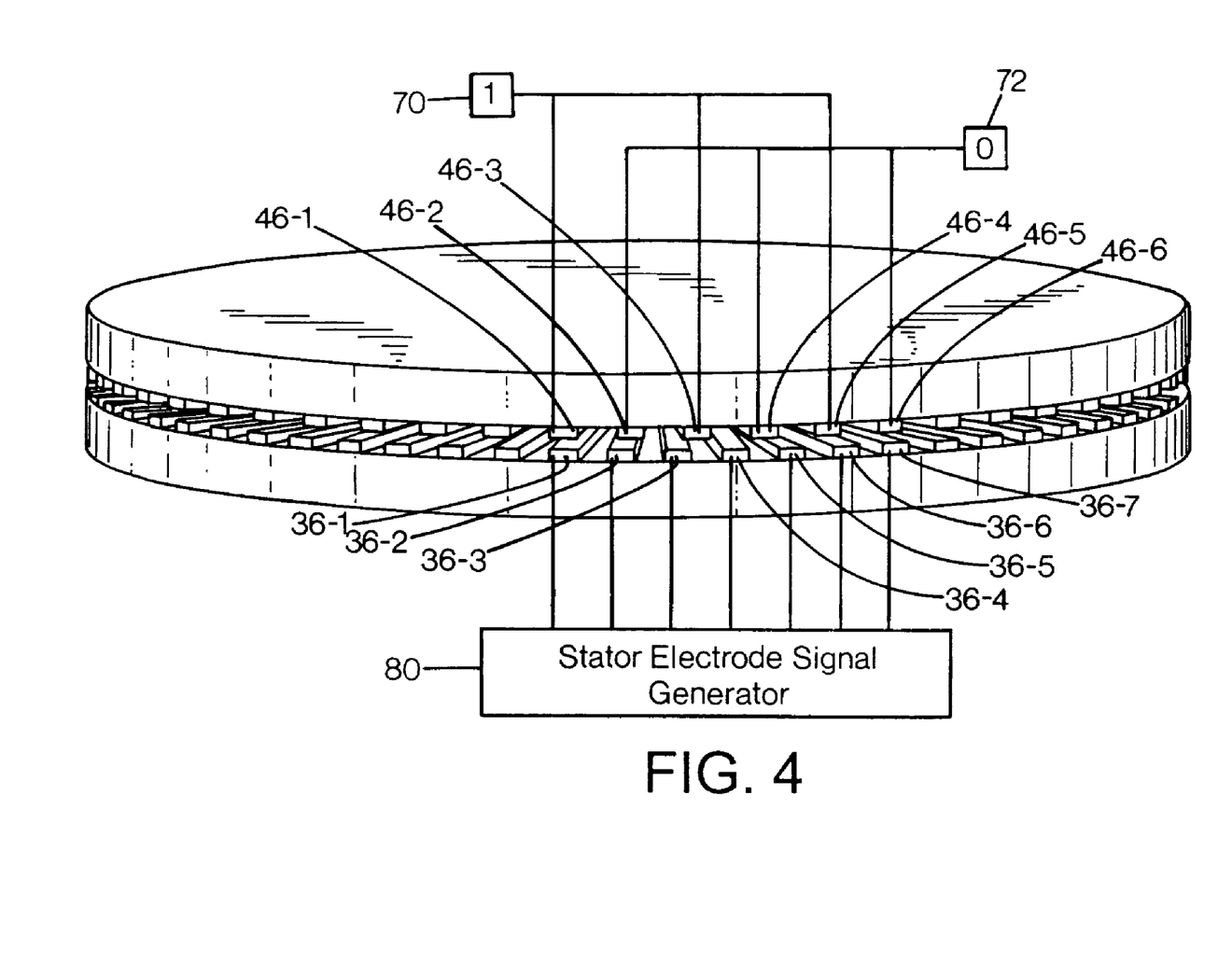
FIG. 4 is a simplified motor driver schematic showing an exemplary circuit for driving the micro mover of FIGS. 1–3.

FIG. 4 is a simplified schematic diagram of the micro mover 20, showing an exemplary drive circuit. In this exemplary embodiment, the voltage pattern on the rotor electrodes 46 is static and alternating, and is applied by applying the voltage source 70 to a set of alternating electrodes 46-1, 46-3, 46-5, . . . , and by connecting the voltage source 72 to the adjacent alternating electrodes 46-2, 46-4, 46-6 . . . . The rotor electrodes can be connected to the voltage source 72 by conductor lines formed on the surface of flexures.

A substantially alternating pattern of voltages is applied to the stator electrodes through the stator electrode signal generator 80. This can be created by applying a voltage level 0 to the alternate electrodes 36-1, 36-3, 36-5, . . . , and a voltage level 1 to adjacent alternating electrodes 36-2, 36-4, 36-6, . . . . Exemplary voltage levels are 0 volts for level 0, and 40 volts for level 1.

The rotor electrode pitch is different from the stator electrode pitch, to produce a tangential force to move the rotor portion. Commonly assigned U.S. Pat. No. 5,986,381, ELECTROSTATIC ACTUATOR WITH SPATIALLY ALTERNATING VOLTAGE PATTERNS, Hoen et al., the entire contents of which are incorporated herein by this reference, describes stepper array arrangements, including radial stepper arrays.

In this embodiment, the stator electrodes are driven in arrays of seven drive electrodes, with the rotor electrodes connected in arrays of six driven electrodes, although this arrangement can be reversed, with the stator electrodes connected as the driven electrodes, and the rotor electrodes connected as the drive electrodes. In this embodiment, each driven array has an even number (Nr) of electrodes, and each drive array has an odd number (Ns) of electrodes, with Ns=Nr+/−1. The opposed surfaces of the rotor and stator are spaced apart by a distance d. By introducing a local disruption in the alternating voltage pattern on the stator, the rotor can be rotated about its axis by a precise distance. The micro mover can be operated as a step motor, with each step size equal to the ratio of the drive array pitch, i.e. the spacing between adjacent electrodes, and the number of electrodes in each drive array. Assume for this example that the pitch spacing is 2 µm, and the number of drive electrodes in each drive array is 7, so that the step size is 2/7 µm.

An example of the drive voltage on the rotor and stator electrodes is set out below, for 14 electrode states.
Ns=7, Nr=6
Rotor: 1 0 1 0 1 0
Stator:
0 1 2 3 4 5 6
0: 1 0 1 0 1 0 1
1: 0 0 1 0 1 0 1
2: 0 1 1 0 1 0 1
3: 0 1 0 0 1 0 1
4: 0 1 0 1 1 0 1
5: 0 1 0 1 0 0 1
6: 0 1 0 1 0 1 1
7: 0 1 0 1 0 1 0
8: 1 1 0 1 0 1 0
9: 1 0 0 1 0 1 0
10: 1 0 1 1 0 1 0
11: 1 0 1 0 0 1 0
12: 1 0 1 0 1 1 0
13: 1 0 1 0 1 0 0
14: 1 0 1 0 1 0 1

Thus, with the electrode states set out above, the rotor will be incrementally stepped in its position. By repeating the pattern of states, further steps can be obtained, with the rotor incrementally stepped from its rest position.

Some applications may utilize only two rotor positions, to position the mirror in one position or the other. Other applications will utilize many rotor positions to move the mirror through a range of movement.

The rotor position can also be moved in an "analog" sense, by modulating the magnitude of voltage level 1 applied to the electrode whose voltage is being changed. This will provide the capability of not only moving in steps, but also varying the size of the steps. For example, the electrode voltage could be ramped from 0 V to 40 V, instead of stepping from 0 V to 40 V.

Figure 5:
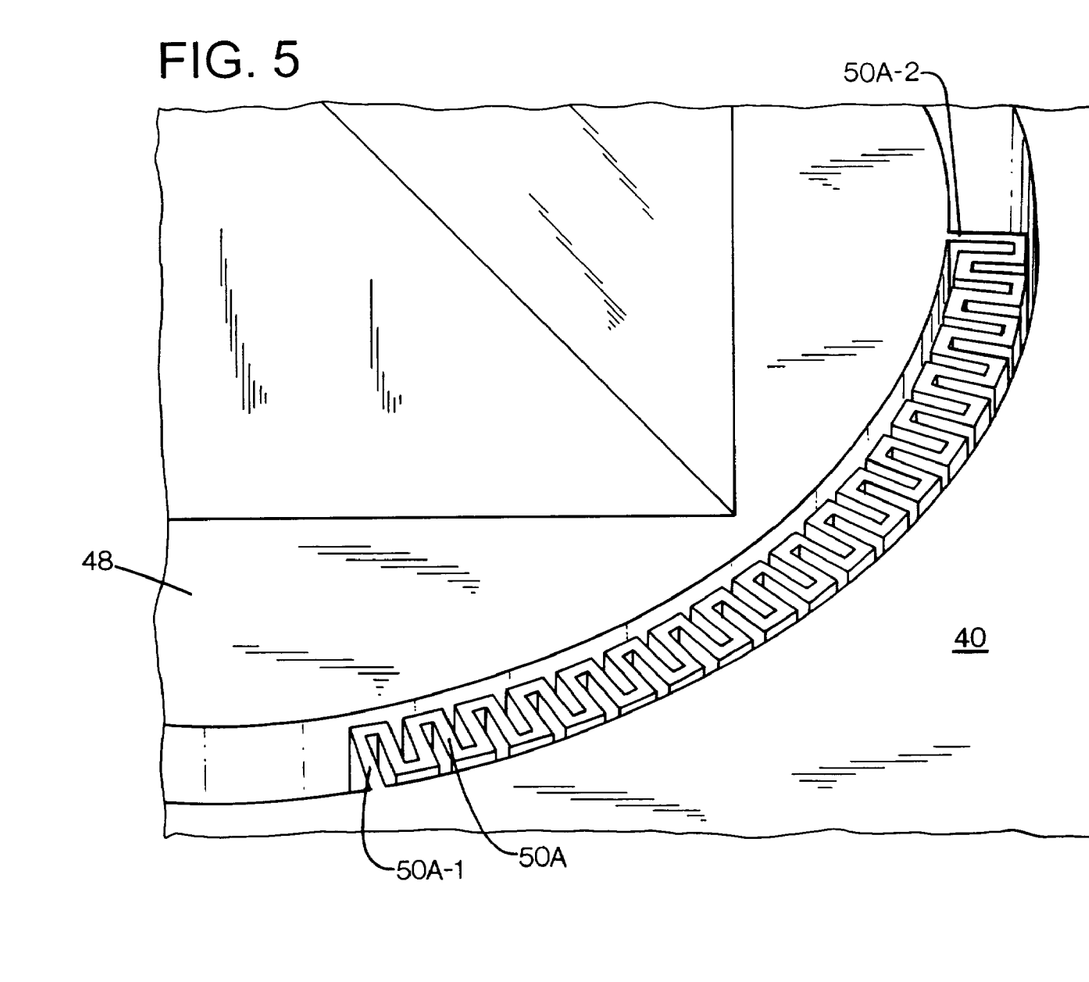
FIG. 5 is an enlarged fragmentary isometric view of a portion of the micro mover of FIG. 1, showing the flexure in further detail.

The flexure structure 50 is shown in further detail in the enlarged fragmentary isometric view of FIG. 5. The rotor portion 48 has a circular periphery, and the flexure structure provides a suspension structure which supports the rotor portion 48 in relation to the rotor substrate structure 40. As shown in FIG. 1, the flexure structure 50 includes three flexure portions 50A, 50B, and 50C, each following the circular periphery of the rotor portion in a generally arc-shaped fashion. The flexure portions are serpentine structures having one end integrally connected to the rotor portion, and the other distal end connected to the rotor substrate 40. Thus, as shown in FIG. 5, flexure portion 50A has a first end 50A-1 connected to the rotor substrate 40, and a second end 50A-2 connected to the rotor 48. In an exemplary embodiment, the substrate 40, rotor 48 and flexure 50 are all fabricated as a unitary structure from a silicon wafer, with the flexure defined by selectively etching the silicon to define the flexure pattern. Arcuate slots 52A, 52B, 52C are defined in the silicon substrate around the periphery of the rotor portion between the three flexures 50A, 50B, 50C.

In an exemplary embodiment, the rotor portion has a diameter of 1 mm, and the flexure structures 50A, 50B, 50C each subtend an angle of 80 degrees. The rotor substrate has a thickness of 100 µm.

The micro mirror device can be used for deflecting the light to different location, which is a popular approach now as all-optical switch for fiber optic communication. A micro mover embodying the invention can be used in many applications. Exemplary applications include optical cross connects for optical communication, display devices, spatial light modulators and scanning mirrors.

Figure 6:
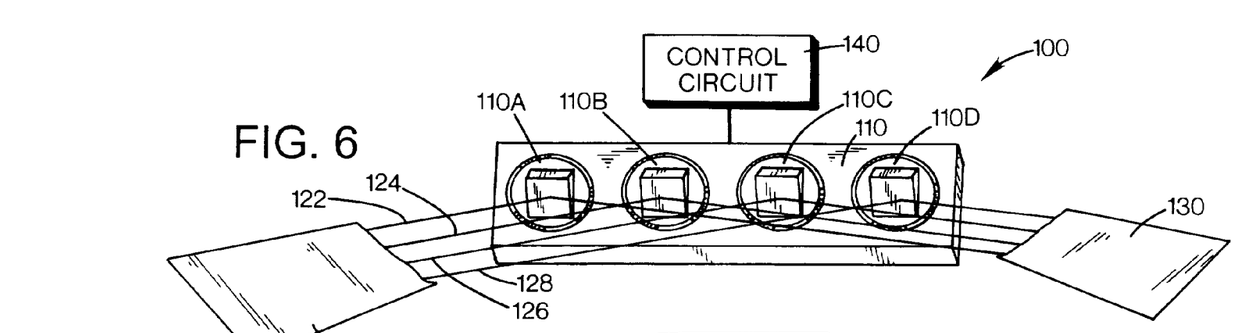
FIG. 6 shows an exemplary embodiment of a system employing a one dimensional array of micro mirror devices on a substrate.

FIG. 6 illustrates an exemplary embodiment of a system 100 employing a one dimensional array of micro mover devices as illustrated in FIGS. 1–4. The one dimensional array 110 comprises micro mover devices 110A, 110B, 110C, 110D each having a micro mirror for selectively deflecting an input beam of light from an input device 120 to an output device 130. The array 110 can comprise a unitary structure of the four micro mover devices. A control circuit 140 provides the voltages on the devices 110A–110D in order to control the devices. The control circuit 140 provides control over the positions of the mirrors comprising the array 100, and thus allows the respective input light beams 122, 124, 126, 128 to be deflected by the array mirrors to respective output positions on device 130. In an exemplary application, each mirror has four positions, and so there are four corresponding output light positions for each mirror on the output device. This system can be employed in an optical switch application such as an optical cross-connect system, wherein each input can be switched to any of four outputs, by way of example.

Figure 7:
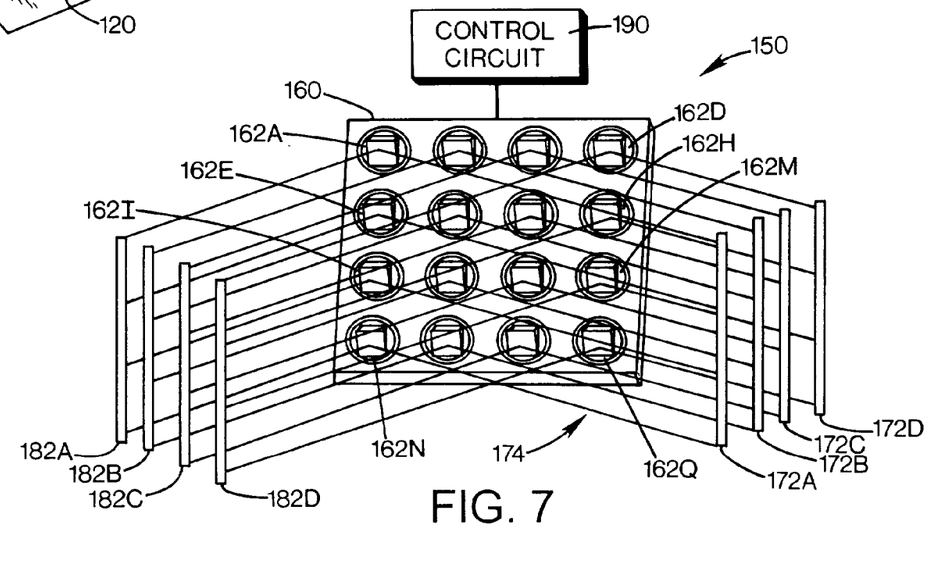
FIG. 7 shows an embodiment of a system employing a two dimensional array of micro mirror devices on a substrate.

FIG. 7 illustrates a simplified schematic view of a system 150 employing a two dimensional array of micro mover devices as illustrated in FIGS. 1–4. The two dimensional array 110 comprises four rows of micro mover devices 162A–162D, 162E–162H, 162I–162M, 162N–162Q, each device each having a micro mirror for selectively deflecting an input beam of light from input optical grating devices 172A, 172B, 172C, 172D to a corresponding set of output devices 182A, 182B, 182C, 182D. The input grating devices separate input light spectrally into beams of light for the respective micro mover mirror devices. The array 160 can comprise a unitary structure of the micro mover devices. A control circuit 190 provides the respective voltages on the devices 162A–162Q in order to control the devices. The control circuit 190 provides control over the positions of the mirrors comprising the array 150, and thus allows the respective input light beams referred to generally as beams 174 to be deflected by the array mirrors to respective output positions on output devices 182A–182D. In an exemplary application, each mirror has four positions, and so there are four corresponding output light positions for each mirror on the output devices. This system can be employed in an optical switch application such as a two-dimensional cross-connect switch, by way of example.

Figure 8A:
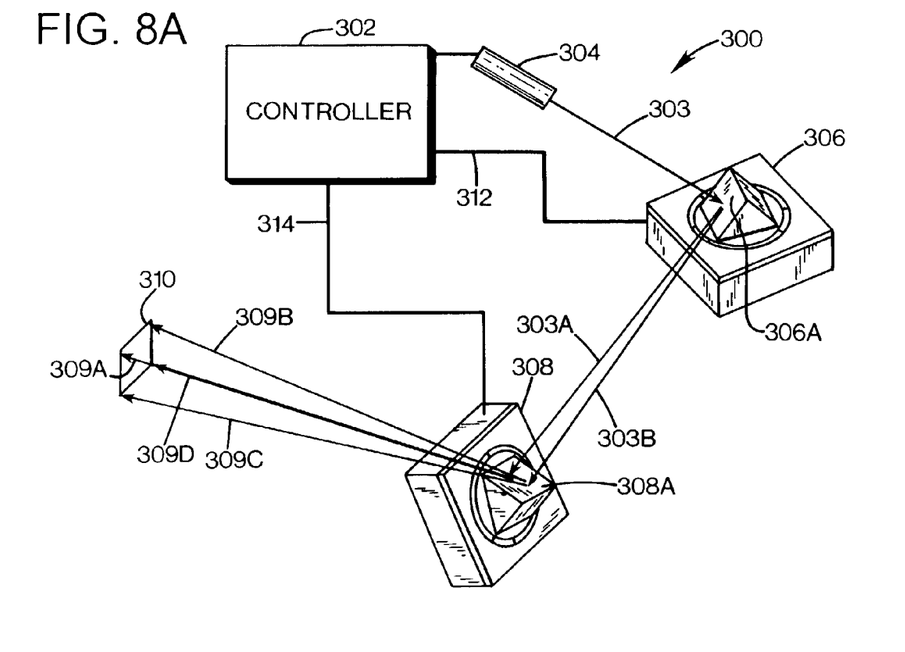
FIG. 8A is a schematic diagram of an exemplary embodiment of a display device employing rotary micro mirror devices.

FIG. 8A illustrates an exemplary embodiment of a raster-scanning display system 300 employing rotary micro movers 306, 308 as illustrated in FIGS. 1–5. A display controller 302 provides control signals to an optical beam generator 304 to generate a beam 303. The optical beam generator 304 in an exemplary embodiment is a laser, but other light sources can alternatively be employed. The generator 304 also includes a light intensity modulation means to vary the light intensity. Suitable light intensity modulation means are well known in the art, such as an iris shutter device, or an LCD modulator, by way of example only. The controller 302 also provides line scan control signals 312 to control micro mover 306 for line (horizontal) scanning, and frame scan control signals 314 to control micro mover 308 for frame (vertical) scanning. The mirror 306A has many positions, depending on the state of the line control signal, to deflect the incident beam 303 along a line starting at beam 303A and ending at beam 303B. The beams reflected by mirror 306A are incident on mirror 308A, which is scanned through its range of motion more slowly than the mirror 306A. The mirror 308A has many positions, controlled by the frame scan control signals 314, to provide a frame having a vertical extent comprising multiple lines at the output optical device 310. The frame vertical and lateral extents are defined by beam 309A, 309B, 309C or 309D. The fast rotation of the mirror 306A generates line sweeping. The number of the mirror 306A positions determines the display resolution. The beams reflected by the mirror 306A are incident on mirror 308A, which is a line for a given position of mirror 308A. The beams reflected by the slow rotating mirror 308A are expanded to a full frame. The input light source is modulated with the picture or image signal to provide the full image frame.

Figure 8B:
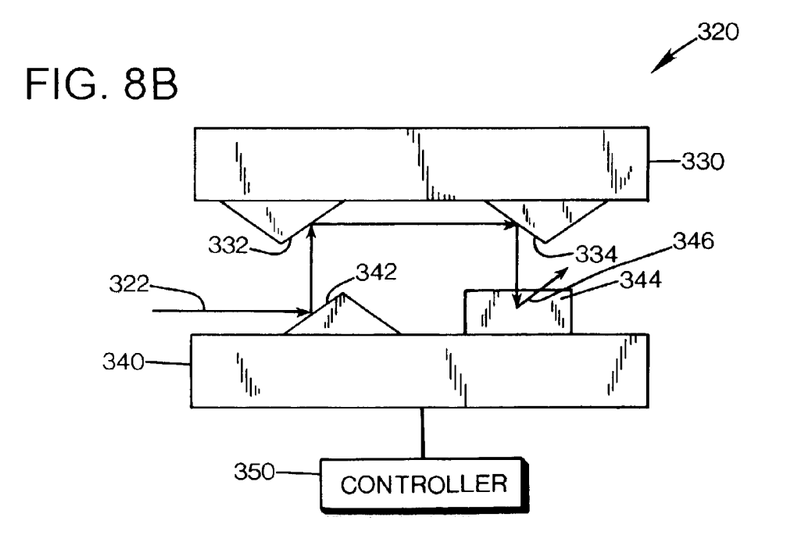
FIG. 8B is a schematic diagram of an exemplary second embodiment of a display device employing rotary micro mirror devices.
Figure 9A:
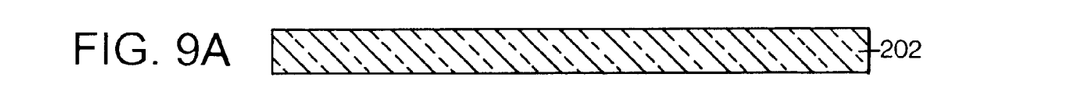
FIGS. 9A–9F illustrate an embodiment of an exemplary technique for fabricating a stator substrate.
Figure 9B:
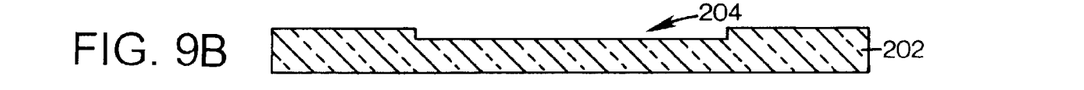
Figure 9C:
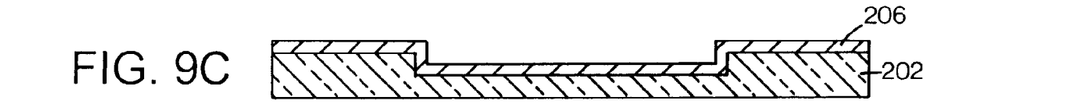
Figure 9D:
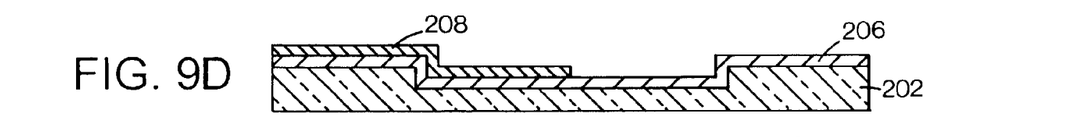
Figure 9E:
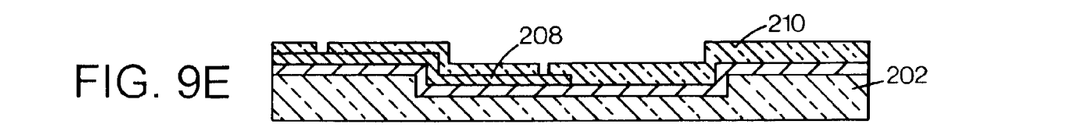
Figure 9F:
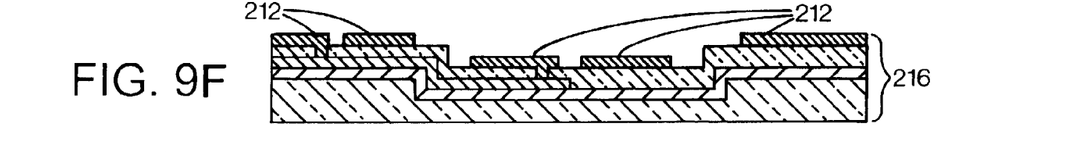

FIG. 8B shows an exemplary second embodiment of a display system 320 embodying rotary micro mover devices in accordance with the invention. This system employs two fixed mirrors 332 and 334 mounted on substrate 330, and two rotary micro mirror devices having mirrors 342, 344, which are mounted on substrate 340. A controller 350 provides control signals to set the electrostatic voltages on the two rotary micro movers to set the positions of the mirrors 342, 344. An input beam 322 of light is deflected from mirror 342 to mirror 332 to mirror 334 to mirror 344 to an output device (not shown in FIG. 8B) as output beam 346. The fixed mirrors are disposed opposite each other to redirect the input beam reflected by the mirror 342 by 180 degrees to mirror 344. As in the system of FIG. 8A, the beam 322 can be reflected and expanded to a full frame of an image on the output device, if the input light source is modulated with the picture signal accordingly.

An exemplary process flow for constructing the device 20 is shown in FIGS. 9A–11D. FIGS. 9A–9F illustrate an exemplary technique for fabricating the stator substrate structure 30. The process starts with a wafer 202 of bare silicon (FIG. 9A), of a thickness in this embodiment on the order of a few hundred microns, e.g. 500–600 microns. The wafer is then subjected to a cavity etch process using a first mask to etch a cavity 204 in the silicon, as shown in FIG. 9B. Then an oxide layer 206 is formed on the top surface of the etched silicon (FIG. 9C). A patterned interconnect layer 208 of conductive material such as aluminum is formed on the oxide layer, using a second mask. A patterned isolation layer 210, e.g. an oxide layer, is formed over the structure of FIG. 9D, as shown in FIG. 9E. Then a patterned layer 212 of metal is deposited on the structure of FIG. 9E, forming the stator electrodes and forming a stator wafer structure 216 (FIG. 9F).

Figure 10A:
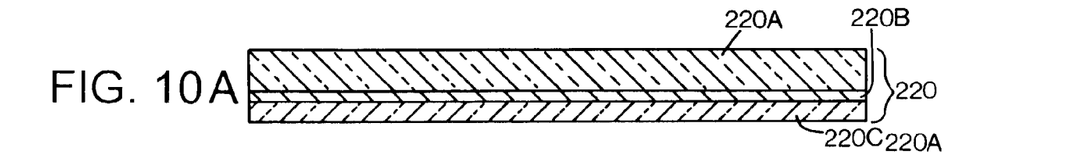
FIGS. 10A–10D illustrate an embodiment of an exemplary technique for fabricating a rotor substrate.
Figure 10B:
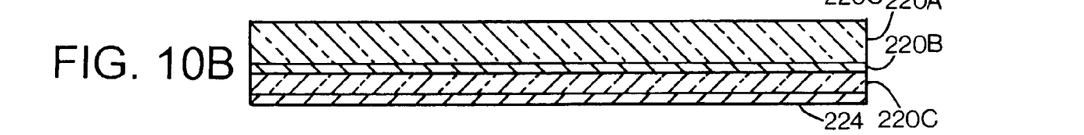
Figure 10C:
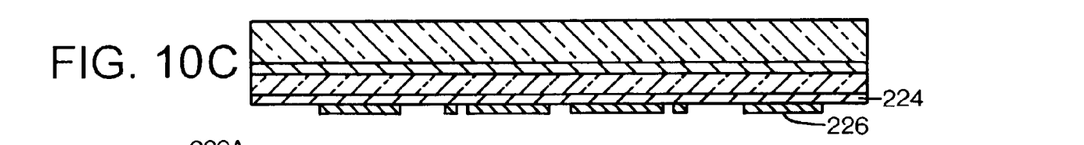
Figure 10D:
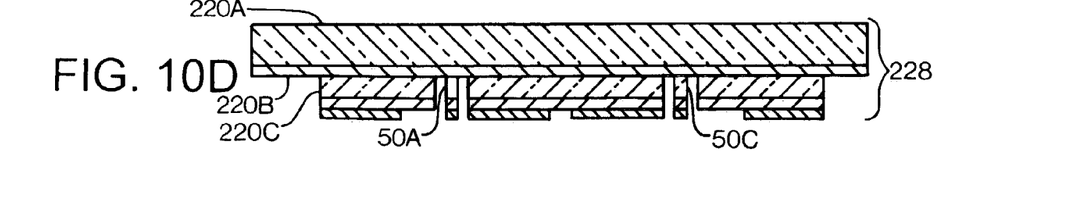

FIGS. 10A–10D show an exemplary process for forming the rotor substrate structure 40. The process employs a silicon-on-insulator (SOI) structure 220 (FIG. 10A), comprising a silicon substrate layer 220A, an oxide layer 220B and a thinner silicon device layer 220C, e.g. having a thickness on the order of 100 microns A layer 224 of oxide is grown on a surface of the structure of FIG. 10A, as illustrated in FIG. 10B. Using a fifth mask, a patterned layer 226 of metal is formed on the oxide layer 224, as shown in FIG. 10C. An etch process is then conducted through a sixth mask, forming the flexure for the rotor substrate structure, and forming a rotor wafer structure 228.

Figure 11A:
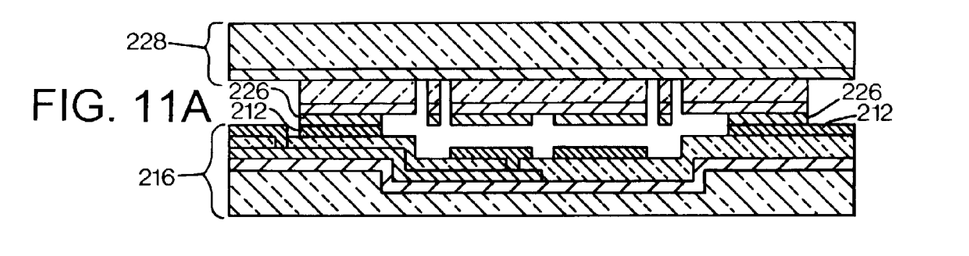
FIGS. 11A–11D illustrate an embodiment of an exemplary technique for bonding the rotor substrate to the stator substrate and fabricating a micro mirror.
Figure 11B:
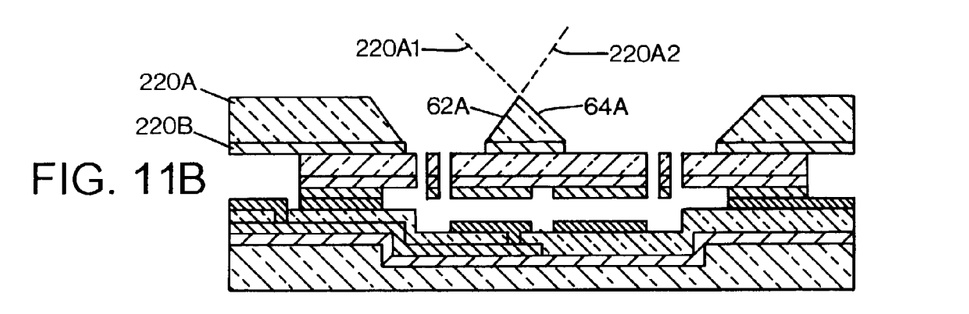
Figure 11C:
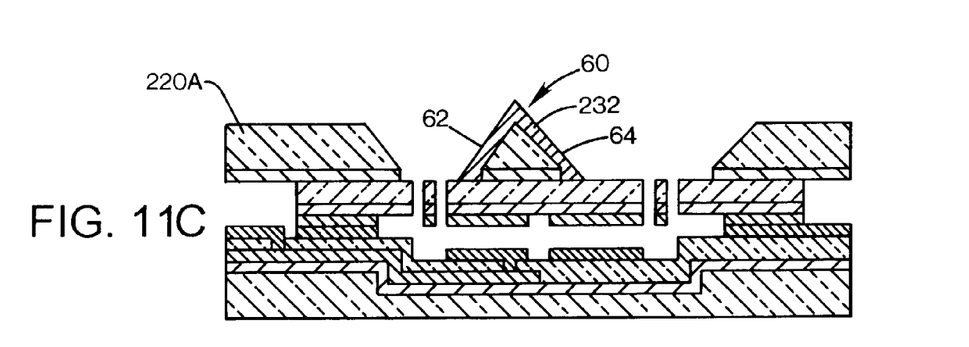
Figure 11D:
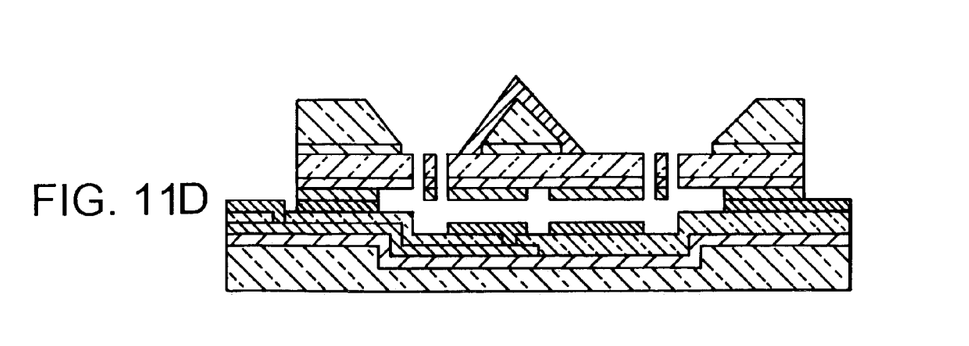

FIGS. 11A–11D show an exemplary technique for joining the stator wafer structure 216 and the rotor wafer structure 228. As shown in FIG. 11A, the structures 216 and 228 are aligned so that contact pads comprising the metal layers 212 and 226 are in contact. A eutectic bonding process is performed, using application of heat to bond the metal contacts together. Next, etching processes are employed using a seventh mask to etch the silicon substrate 220A along crystal planes to form the mirror planes 62A, 62B. In this exemplary embodiment, a first, wet etch process is conducted through the seventh mask. This can be a KOH (Potassium hydroxide) or TMAH (Tetra Methyl Ammonium Hydroxide) etch, which etches the silicon along the [111] crystal planes 220A1, 220A2, with the oxide layer 220B serving as an etch stop surface. A second etch is conducted through the seventh mask to selectively remove the oxide layer 220B, with the resultant structure illustrated in FIG. 11B. A metal coating 232 is applied to the silicon mirror planes 62A. 64A to provide the highly reflective mirror surfaces 62, 64. This can be done using an eighth mask with a shadow mask procedure, sputtering the metal layer through the shadow mask, although other techniques can also be used. The resultant structure is then subjected to a double dicing singulation procedure to separate the die into individual micro mover devices or arrays of micro mover structures as illustrated in FIG. 11D. A first dicing procedure slices the rotor substrate and also opens up the bond pad areas. A second dicing procedure slices the stator substrate.

Figure 12:
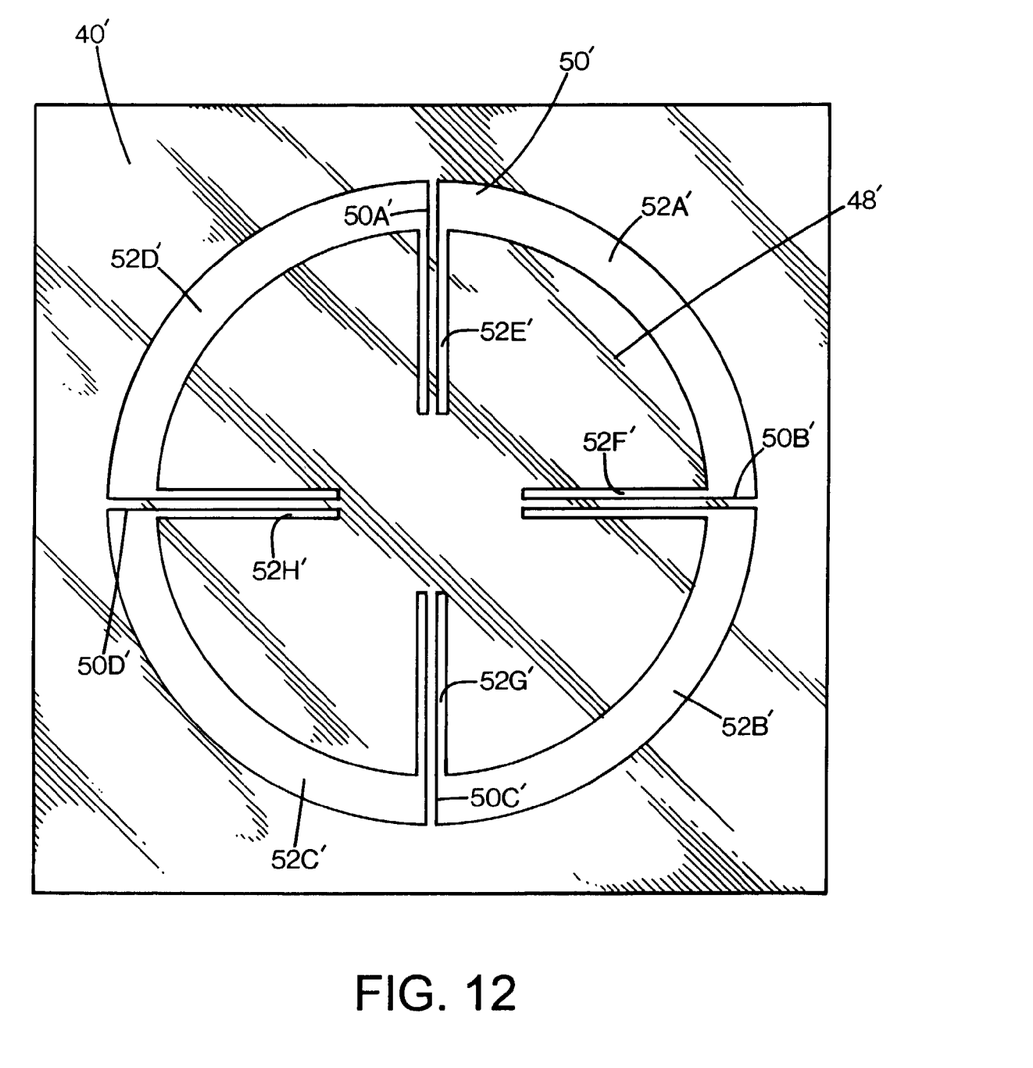
FIG. 12 is a top view of an alternate embodiment of a rotor structure, showing an alternate flexure structure.

Other flexure structures can alternatively be used to support the rotor portion relative to the rotor substrate. FIG. 12 depicts an alternate rotor structure 40', with an exemplary alternate flexure structure 50' supporting the rotor portion 48' relative to the substrate 40'. The alternate flexure structure 50' includes a plurality of radially extending flexure beam portions 50A', 50B', 50C' and 50D' extending between the rotor substrate portion 40' and the rotor portion 48'. The flexure structure and the rotor substrate portion are formed from the rotor substrate, as an integral structure. Arcuate slot portions 52A', 52B', 52C' and 52D' and radial slot portions 52E', 52F', 52G' and 52H' are formed in the substrate to define the flexure beam portions, which in an exemplary embodiment have widths in the range of 2 microns to 5 microns. While four radial beams are illustrated, it will be understood that fewer or more beams could be employed. The range of radial movement can be increased by tapering the slot portions 52F', 52G' and 52H1 to have larger widths at the rotor portion periphery than at the rotor center.

It is understood that the above-described embodiments are merely illustrative of the possible specific embodiments which may represent principles of the present invention. Other arrangements may readily be devised in accordance with these principles by those skilled in the art without departing from the scope and spirit of the invention.

What is claimed is:

1. A micro-mirror device, comprising:
   a stator structure having a set of radial stator electrodes;
   a rotor structure having a set of radial rotor electrodes;
   a mirror mounted on the rotor structure; and
   a flexure structure suspending the rotor structure relative to the stator structure.

2. The device of claim 1, wherein the stator structure is defined on a first substrate, and the rotor structure and the flexure structure are defined on a second substrate.

3. The device of claim 2, wherein the rotor structure has a generally circular periphery, and said flexure structure is a serpentine structure defined from said second substrate.

4. The device of claim 3, further comprising a driver circuit electrically connected to the stator electrodes and the rotor electrodes for imparting rotary electrostatic forces tending to rotate the rotor about an axis of rotation, and a conductor trace connecting the driver circuit to the rotor electrodes, said conductor trace passing over said flexure structure.

5. The device of claim 2, wherein the flexure structure is defined by voids in said second substrate.

6. The device of claim 2, wherein the flexure structure comprises a plurality of radially extending beam portions defined from said second substrate.

7. The device of claim 2, wherein the mirror structure is fabricated on said second substrate.

8. The device of claim 7, wherein said mirror structure includes a mirror plane defined along a crystal plane of said second substrate.

9. The device of claim 8, wherein said mirror structure includes a reflective coating layer applied to said mirror plane.

10. The device of claim 1, further comprising a driver circuit electrically connected to the stator electrodes and the rotor electrodes for imparting rotary electrostatic forces tending to rotate the rotor about an axis of rotation.

11. The device of claim 10, wherein said rotor has a rest position, and said driver circuit has a state which tends to drive the rotor to a driven position.

12. A display device including the micro-mirror device of claim 1.

13. The display device of claim 12, wherein the display device is a raster-scanning display system.

14. An optical switch including the micro-mirror device of claim 1.

15. A spatial light modulator including the micro-mirror device of claim 1.

16. A method of using the micro mirror device of claim 1, comprising:
    applying an alternating pattern of fixed voltages to arrays of the rotor electrodes, wherein each rotor array consists of an even number Nr of rotor electrodes;
    applying a substantially alternating pattern of voltages to arrays of the stator electrodes, wherein each stator array consists of an odd number Ns of stator electrodes;
    introducing a local disruption in the substantially alternating pattern of voltages applied to the stator arrays to generate a radial electrostatic force tending to rotate the rotor.

17. An array of micro mirrors, comprising:
    a plurality of micro mover devices, each having a micro mirror for selectively deflecting an input beam of light from an input device to an output device;
    each said micro mover device comprising:
       a stator structure having a set of radial stator electrodes;
       a rotor structure having a set of radial rotor electrodes, the mirror mounted on the rotor structure;
       a flexure structure suspending the rotor structure relative to the stator structure.

18. The array of claim 17, wherein the plurality of micro movers are arranged along a linear array axis as a one dimensional array.

19. The array of claim 17, wherein the plurality of micro movers are arranged in a two dimensional array.

20. The array of claim 19, wherein the plurality of micro movers are arranged in rows and columns.

21. The device of claim 17, wherein the stator structure of each of the plurality of micro movers is defined on a common first substrate, and the rotor structure and the flexure structure of each of the plurality of micro movers are defined on a common second substrate.

22. The device of claim 21, wherein the rotor structure for each micro mover has a generally circular periphery.

23. The device of claim 22, wherein the flexure structure for each micro mover is a serpentine structure defined from said second substrate.

24. The device of claim 22, wherein the flexure structure for each micro mover comprises a plurality of radially extending beam portions.

25. The array of claim 17, further comprising a control circuit connected to the plurality of micro mover devices providing voltages to control the position of the micro mirror of each micro mover device.

26. The device of claim 25, wherein the control circuit is electrically connected to the stator electrodes and the rotor electrodes for each micro mover for imparting rotary electrostatic forces tending to rotate the rotor about an axis of rotation.

27. The device of claim 21, wherein the flexure structure is defined by voids in said second substrate.

28. The device of claim 21, wherein the micro mirror of each micro mover is fabricated on said second substrate.

29. The device of claim 28, wherein the micro mirror of each micro mover is on a mirror plane defined along a crystal plane of said second substrate.

30. A micro mirror device, comprising:
    a stator structure having a set of radial stator electrodes;
    a rotor structure having a set of radial rotor electrodes;
    a mirror mounted on the rotor structure; and means for suspending the rotor structure relative to the stator structure and allowing radial movement of the rotor structure in a range of movement about a rotor axis.

31. The device of claim 30, wherein the stator structure is defined on a first substrate, and the rotor structure is defined on a second substrate.

32. The device of claim 31, wherein said suspending means comprises a flexure structure defined by voids formed in the second substrate.

33. The device of claim 32, wherein the rotor structure has a generally circular periphery, and said flexure structure is a serpentine structure defined from said second substrate.

34. The device of claim 32, wherein rotor structure has a generally circular periphery, and the flexure structure comprises a plurality of radially extending beam portions defined from said second substrate.

35. The device of claim 31, further comprising a driver circuit electrically connected to the stator electrodes and the rotor electrodes for imparting rotary electrostatic forces tending to rotate the rotor about said axis of rotation.

36. The device of claim 31, wherein the mirror structure is fabricated on said second substrate.

37. The device of claim 31, wherein said mirror structure includes a mirror plane defined along a crystal plane of said second substrate.

38. A raster-scanning display system, comprising:
a generator for generating an optical beam;
a first micro mirror device responsive to line control signals for deflecting the optical beam along a line to produce a first deflected beam;
a second micro mirror device responsive to frame control signals for deflecting the first deflected beam to produce a second deflected beam;
a controller for controlling the generator and for producing the line control signals and the frame control signals;
the first and second micro mirror devices each including:
 a stator structure having a set of radial stator electrodes;
 a rotor structure having a set of radial rotor electrodes;
 a mirror mounted on the rotor structure; and
 a flexure structure suspending the rotor structure relative to the stator structure.

39. A display system, comprising:
a generator for generating an optical beam;
a first micro mirror device responsive to first control signals for deflecting the optical beam to produce a first deflected beam;
a fixed mirror system for redirecting the first deflected beam as a second deflected beam;
a second micro mirror device responsive to second control signals for deflecting the second deflected beam to produce a third deflected beam;
a controller for controlling the generator and for producing the first and second control signals;
the first and second micro mirror devices each including:
 a stator structure having a set of radial stator electrodes;
 a rotor structure having a set of radial rotor electrodes;
 a mirror mounted on the rotor structure; and
 a flexure structure suspending the rotor structure relative to the stator structure.

40. The system of claim 39, wherein the stator structure of each of the first and second micro mirror devices is defined on a common first substrate, and the rotor structure and the flexure structure of each of the plurality of micro mirror devices are defined on a common second substrate.

* * * * *